(12) United States Patent
Goto

(10) Patent No.: US 7,954,074 B2
(45) Date of Patent: May 31, 2011

(54) LOGIC DESIGN SUPPORT SYSTEM HAVING RTL ANALYSIS MEANS

(75) Inventor: Atsuko Goto, Tokyo (JP)

(73) Assignee: NEC Corporation, Tokyo (JP)

( * ) Notice: Subject to any disclaimer, the term of this patent is extended or adjusted under 35 U.S.C. 154(b) by 512 days.

(21) Appl. No.: 12/059,368

(22) Filed: Mar. 31, 2008

(65) Prior Publication Data

US 2008/0244502 A1 Oct. 2, 2008

(30) Foreign Application Priority Data

Mar. 30, 2007 (JP) ................................. 2007-090573

(51) Int. Cl.
*G06F 17/50* (2006.01)
*G06F 9/45* (2006.01)
(52) U.S. Cl. ......... 716/103; 716/104; 716/136; 717/136

(58) Field of Classification Search .................. 716/1, 3, 716/18, 100–101, 103–104, 136; 717/136
See application file for complete search history.

(56) References Cited

FOREIGN PATENT DOCUMENTS

| JP | 2000011010 A | 1/2000 |
|---|---|---|
| JP | 2003085221 A | 3/2003 |
| JP | 2006260288 A | 9/2006 |
| JP | 2006285333 A | 10/2006 |

*Primary Examiner* — Stacy A Whitmore

(57) ABSTRACT

A logic design support system which supports logic design using an HDL includes: RTL analysis means for receiving, as input, an RTL including a dedicated comment as a comment statement specifying expansion of a generate statement, detecting the dedicated comment from the input RTL, and retrieving a generate statement to be expanded; logic expansion means for expanding the generate statement retrieved by the RTL analysis means; and RTL output means for merging a portion not retrieved by the RTL analysis means from the input RTL with a portion expanded by the logic expansion means, and generating and outputting output RTL.

5 Claims, 4 Drawing Sheets

```
           ⋮                            ⟩~21

//*#EXPST $ins_1_$i     ~22    23 generate
genvar i ;
for (i=0; i<64; i=i+1)
begin
  sub1 AAA (.p1(A), .p2(P[i]));
end
endgenerate

//*#EXPEND          ~24    25 generate
genvar i ;
for (i=0; i<32; i=i+1)
begin
  assign Q[i][31:0] = S[i] ? B[i][31:0]
                           : C[i][31:0] ;
end
endgenerate ~26
//*#EXPST $ins_2_$i generate
genvar i ;
for (i=0; i<128; i=i+1)     ⟩~27
begin
  sub1 AAA (.p1(A), .p2(R[i]));
end
endgenerate

//*#EXPEND          ~28    29

```
//**EXPST $ins_1_$i sub1 AAA_1_0 (.p1(A), .p2(P[0]));
  sub1 AAA_1_1 (.p1(A), .p2(P[1]));
  sub1 AAA_1_2 (.p1(A), .p2(P[2]));
        :
        :
  sub1 AAA_1_62 (.p1(A), .p2(P[62]));
  sub1 AAA_1_63 (.p1(A), .p2(P[63]));

//**EXPEND
```

31

```
//**EXPST $ins_2_$i sub1 AAA_2_0 (.p1(A), .p2(R[0]));
  sub1 AAA_2_1 (.p1(A), .p2(R[1]));
  sub1 AAA_2_2 (.p1(A), .p2(R[2]));
        :
  sub1 AAA_2_126 (.p1(A), .p2(R[126]));
  sub1 AAA_2_127 (.p1(A), .p2(R[127]));

//**EXPEND
```

```
//**EXPST $ins_1_$i sub1 AAA_1_0  (.p1(A), .p2(P[0]));
  sub1 AAA_1_1  (.p1(A), .p2(P[1]));
  sub1 AAA_1_2  (.p1(A), .p2(P[2]));
       ⋮
  sub1 AAA_1_62 (.p1(A), .p2(P[62]));
  sub1 AAA_1_63 (.p1(A), .p2(P[63]));

//**EXPEND
```
〜42

```
generate
genvar i ;
for (i=0; i<32; i=i+1)
begin
  assign Q[i][31:0] = S[i] ? B[i][31:0]
                           : C[i][31:0] ;
end
endgenerate
```
〜43

```
//**EXPST $ins_2_$i sub1 AAA_2_0   (.p1(A), .p2(R[0]));
  sub1 AAA_2_1   (.p1(A), .p2(R[1]));
  sub1 AAA_2_2   (.p1(A), .p2(R[2]));
       ⋮
  sub1 AAA_2_126 (.p1(A), .p2(R[126]));
  sub1 AAA_2_127 (.p1(A), .p2(R[127]));

//**EXPEND
```
〜44

LOGIC DESIGN SUPPORT SYSTEM HAVING RTL ANALYSIS MEANS

This application is based upon and claims the benefit of priority from Japanese patent application No. 2007-090573, filed on Mar. 30, 2007, the disclosure of which is incorporated herein in its entirety by reference

BACKGROUND OF THE INVENTION

1. Field of the Invention

The present invention relates to a system for and method of supporting the logic design of an LSI (large-scale integrated circuit) and the like, and more specifically, to a logic design support system and method capable of appropriately performing logic verification even in a case that a "generate" statement is used when the design is generated using Verilog and the like as a hardware description language (HDL).

2. Description of the Related Art

Generally, in designing and fabricating a semiconductor device such as an LSI, hardware is described in a hardware description language, logic verification is performed by logic synthesis based on the description, and then the semiconductor device is practically fabricated. As an LSI to be designed becomes larger, the amount of descriptions to be presented by a designer increases. To reduce the work of the designer by decreasing the amount of descriptions in describing the hardware, it is effective to efficiently describe the structure which is repeatedly presented in the hardware description. When a designing process is performed in the HDL, a configuration of a hierarchy of n layers per type or a generate statement can be effectively utilized to simplify the description of a repetitive structure, n being an integer larger than one. With the Verilog which is frequently used as an HDL, the generate statement can be used, and the amount of descriptions at an RTL (register transfer level) can be reduced using the generate statement.

However, a frequently repeated description makes it difficult for an automatic verification tool to automatically match a register from a tree structure of a net list when logic verification is performed, and the logic verification requires a longer time. The reason for the problem is that a general-purpose logic verification tool performs a verification on each logic cone segmented by a register for matching between a verifying RTL and an RTL to be verified while there are a number of the same tree structures of a net list under the hierarchy of n layers per type, thereby disabling the verification tool to automatically perform matching. When a generate statement is used, a logic synthesis tool arbitrarily generates a hierarchical instance name in the generate statement. At this time, in a black box under the hierarchy in which an instance name is automatically generated, since the correspondence of input/output pins cannot be specified, a point to be verified cannot be verified. Practically, when a hierarchy that cannot be logically verified such as a hard macro is to be verified in a black box, the input/output pin of the black box functions as a start point and an end point of the verification. Therefore, the logic verification cannot be correctly performed unless the position of the input/output pin is appropriately set by the designer.

The Japanese Patent Laid-Open Application No. 2000-11010 (JP-A-2000-011010) discloses a logic synthesis method in a logic design support system for extracting the type and number of cells being used, an instance name, and a node name from a schematic circuit diagram in a circuit changing operation for changing specifications and the like and performing again the logic synthesis using the extracted instance and the like.

The Japanese Patent Laid-Open Application No. 2003-85221 (JP-A-2003-085221) discloses an automated hierarchical RTL system for easily matching an RTL description and a synthesized logic circuit by converting each logic description of an RTL module into a hierarchical instance to be stored as input/output signal information about the description, and structuring a hierarchy of RTL modules using the hierarchical instances of the modules.

The Japanese Patent Laid-Open Application No. 2006-260288 (JP-A-2006-260288) discloses a method of reading information about a logic circuit having a hierarchy structure, and moving an instance belonging to a predetermined hierarchy to another hierarchy. In this method, when an instance is moved to another hierarchy, a hierarchy port newly required for the movement is generated and connected, and an unnecessary hierarchy port is disconnected and removed with the signal for the instance connected, thereby easily performing an operation of reconfiguring the logic circuit.

The Japanese Patent Laid-Open Application No. 2006-285333 (JP-A-2006-285333) discloses a behavioral synthesis apparatus capable of improving design efficiency by converting supplementary information to be added to a behavioral level circuit description into supplementary information to be added to an RTL circuit description. The apparatus includes: behavioral synthesis means for generating an RTL circuit description based on a behavioral level circuit description, and generating information about the correspondence between the behavioral level circuit description and the RTL circuit description based on the difference between them; and supplementary information conversion means for converting the supplementary information added to the behavioral level circuit description into the supplementary information to be added to the RTL description based on a predetermined conversion rule and the information about the correspondence generated by the behavioral synthesis means.

As described above, in the logic design support system using Verilog as an HDL, when a hierarchy description is made in a generate statement in the input RTL, there arises the problem that it is hard to verify a register under the hierarchy, or a hierarchy to be verified as a black box cannot be verified.

SUMMARY OF THE INVENTION

An exemplary object of the present invention is to provide a logic design support system using Verilog and the like as an HDL (hardware description language), and capable of providing a unique expand instance name when a generate statement is expanded.

Another exemplary object of the present invention is to provide a method for supporting logic design using Verilog and the like as an HDL, and capable of providing a unique expand instance name when a generate statement is expanded.

According to an exemplary aspect of the present invention, a logic design support system which supports logic design using an HDL includes: RTL (register transfer level) analysis means for receiving, as input, an RTL including a dedicated comment as a comment statement specifying the expansion of a generate statement, detecting the dedicated comment from the input RTL, and retrieving a generate statement to be expanded; logic expansion means for expanding the generate statement retrieved by the RTL analysis means; and RTL output means for merging a portion not retrieved by the RTL analysis means from the input RTL with a portion expanded by the logic expansion means, and generating and outputting output RTL.

According to another exemplary aspect of the present invention, a logic design support method which supports logic design using an HDL includes: receiving, as input, an input RTL including a dedicated comment as a comment statement specifying expansion of a generate statement; detecting the dedicated comment from the input RTL; retrieving a generate statement to be expanded; expanding the retrieved generate statement; merging a portion not retrieved by the RTL analysis means from the input RTL with the expanded portion; generating output RTL; and outputting the generated output RTL.

With the configuration, an output RTL expanded in advance can be generated for the generate statement specified by the dedicated comment, thereby preventing a logic synthesis tool from arbitrarily generating a hierarchical instance name, and easily and correctly performing logic verification. That is, according to the exemplary aspects of the present invention, a hierarchical instance described in the generate statement is expanded by an instance name in a specified format, and therefore the hierarchical instance name of the black box under the hierarchy can be uniquely recognized. As a result, the circuit including the black box under the generate statement can be correctly verified, and the matching of a register can be easily performed, thereby considerably shortening the time required for the verification.

The above and other objects, features, and advantages of the present invention will become apparent from the following description based on the accompanying drawings which illustrate examples of preferred embodiments of the present invention.

BRIEF DESCRIPTION OF THE DRAWINGS

FIG. 2 shows an example of a description of input RTL with a dedicated comment;

FIG. 3 shows an example of an RTL provided with an instance name by a logic expansion unit; and FIG. 4 shows an example of an output RTL obtained by an RTL output unit.

DETAILED EXPLANATION OF THE EXEMPLARY EMBODIMENTS

Figure 1:
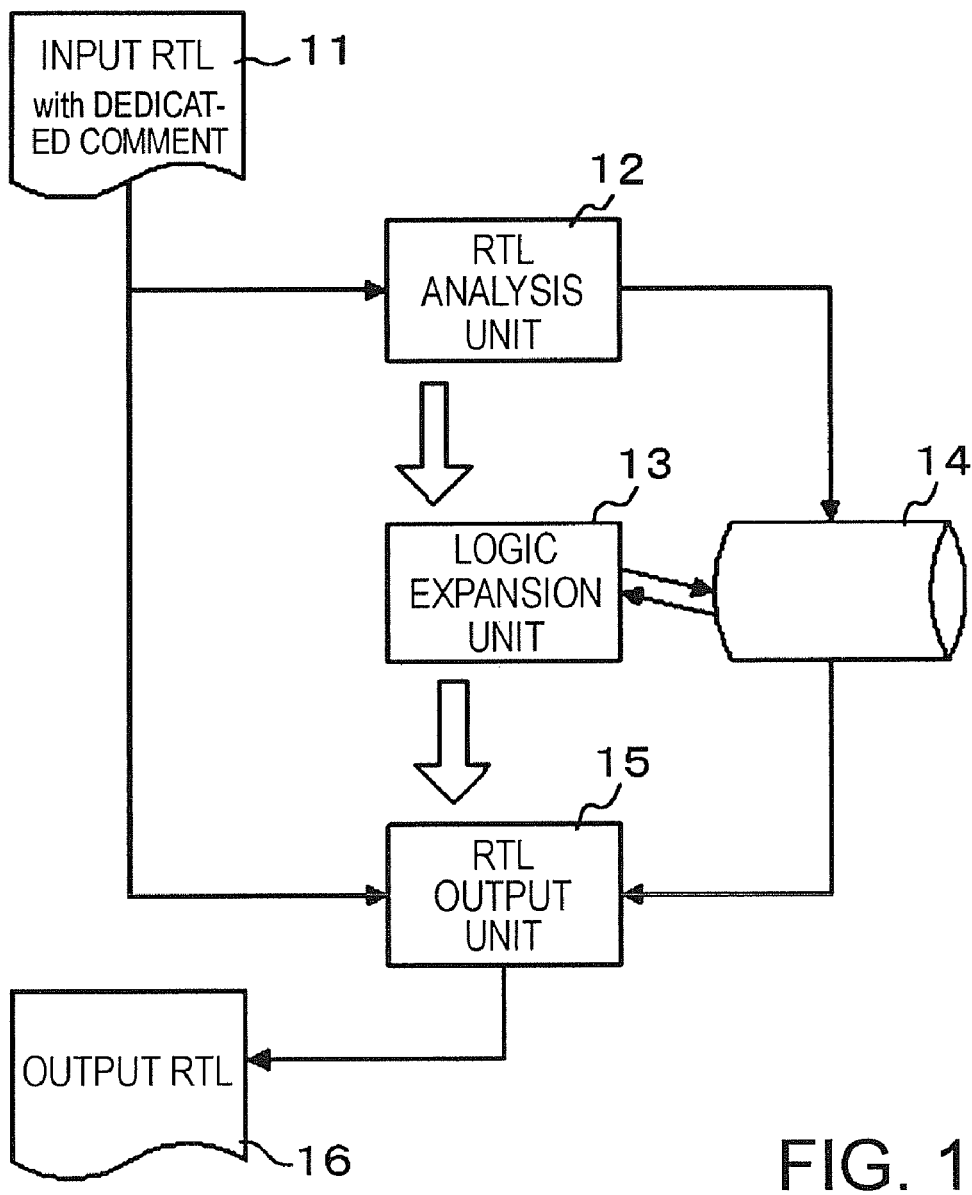
FIG. 1 is a block diagram showing the configuration of a logic design support system according to an exemplary embodiment of the present invention.

The logic design support system according to an exemplary embodiment of the present invention shown in FIG. 1 is provided with input RTL 11 with a dedicated comment as an input RTL described in an HDL, and outputs as output RTL 16 the RTL partially expanded with the instance name recorded by the name of a specified format based on input RTL 11 with a dedicated comment. The logic design support system is provided with RTL analysis unit 12, logic expansion unit 13, and RTL output unit 15, and also internal data storage 14 for storing internal data generated by RTL analysis unit 12, logic expansion unit 13, and RTL output unit 15.

According to the exemplary embodiment, both input RTL 11 with a dedicated comment and output RTL 16 are described by Verilog. FIG. 2 shows an example of the description of input RTL 11 with a dedicated comment. In this example, input RTL 11 is divided into portions 21 to 29 enclosed by the respective rectangular frames indicated by broken lines for explanation.

In input RTL 11 with a dedicated comment shown in FIG. 2, logic descriptions 23 and 27 are generate statements including a hierarchy description, and have, as dedicated comments 22, 24, 26 and 29, a dedicated comment statement as a comment statement indicating the generate statement before and after the generate statement including the hierarchy description. Dedicated comments 22 and 26 starting with "//*#EXPST" is an expansion start comment statement indicating the start of the generate statement including a hierarchy description. In the comment line, a format indicating the instance name used at the expansion can be specified. Dedicated comments 24 and 28 indicated by "//*#EXPEND" is an expansion end comment statement indicating the end of the generate statement including a hierarchy description.

Described below is each constituent component of the logic design support system shown in FIG. 1.

RTL analysis unit 12 receives input RTL 11 with a dedicated comment as input, and has the function of retrieving logic description 23 of a portion enclosed by dedicated comments 22 and 24 in the input RTL, logic description 27 of the portion enclosed by dedicated comments 26 and 28, and the format specification of the instance name specified by dedicated comments 22 and 26.

Logic expansion unit 13 has the function of rewriting the logic description, that is, a generate statement, retrieved by RTL analysis unit 12 into an RTL obtained by expanding a "genvar" variable in the logic description. At this time, the hierarchical instance name of the module instance description is provided as an instance name generated by the format specified by dedicated comments 22 and 26 with respect to the original instance name. FIG. 3 shows the RTL expanded by logic expansion unit 13.

RTL output unit 15 has the function of merging the portion not retrieved by RTL analysis unit 12 from the original RTL, that is, input RTL 11 with a dedicated comment, with the RTL expanded by logic expansion unit 13, thereby generating output RTL 16, and outputting the generated output RTL. In this example, the portions not retrieved by RTL analysis unit 12 are logic descriptions 21, 25 and 28. Logic description 25 is a generate statement, but does not include a hierarchy description. FIG. 4 shows output RTL 16 supplied from RTL output unit 15 when input RTL 11 shown in FIG. 2 is provided.

Described next is the operation of the logic design support system.

When input RTL 11 with a dedicated comment as shown in FIG. 2 is provided for the logic design support system according to the present exemplary embodiment, RTL analysis unit 12 first detects dedicated comments 22 and 26 indicating the start of expansion and dedicated comments 24 and 28 indicating the end of expansion in input RTL 11, and divides the RTL into a portion to be processed, that is, logic descriptions 23 and 27, and other portions, that is, logic descriptions 21, 25 and 29. Then, RTL analysis unit 12 stores the portion to be processed and the other portions in internal data storage 14 as internal data. In the input RTL, plural logic description groups enclosed by the dedicated comments can be included in one module, and each group is stored in internal data storage 14. At this time, RTL analysis unit 12 stores the format specification of an instance name specified by dedicated comments 22 and 26 for the start of expansion in internal data storage 14 as the information about each dedicated comment group. The operation is described below with reference to FIG. 2. That is, logic description group 23 enclosed by dedicated comments 22 and 24 is stored with the format "$ins_1_$i" specified by dedicated comment 22 in internal data storage 14, and logic description group 27 enclosed by dedicated comments 26 and 28 is stored with the format "$ins_2_$i" specified by dedicated comment 26 in internal data storage 14.

Next, logic expansion unit 13 reads the internal data generated by RTL analysis unit 12 from internal data storage 14, and rewrites each group enclosed by the respective dedicated comments to an RTL obtained by expanding a genvar variable. At this time, logic expansion unit 13 assigns an instance name generated in the format specified by a corresponding dedicated comment with respect to an original instance name to the hierarchical instance name of the module instance description. The operation is described below with reference to FIGS. 2 and 3. Logic description group 23 enclosed by dedicated comments 22 and 24 shown in FIG. 2 is stored by the hierarchical instance name of the format "$ins_1_$i" as indicated by description 31 shown in FIG. 3, and logic description group 27 enclosed by dedicated comments 26 and 28 shown in FIG. 2 is stored by the hierarchical instance name of the format "$ins_2_$i" as indicated by description 32 shown in FIG. 3.

Finally, RTL output unit 15 merges the portion other than the portion enclosed by the dedicated comment in the original RTL, that is, input RTL 11 with a dedicated comment shown in FIG. 2, with the RTL expanded by logic expansion unit 13, that is, descriptions 31 and 32 shown in FIG. 3, and outputs the result of the merge as output RTL 16. At this time, to arrange the description order of the logic description or the logic description group as the same order as the original RTL, output RTL 16 includes descriptions 41 to 45 in the order of description 41 identical to logic description 21, description 42 identical to description 31 corresponding to logic description group 23, description 43 identical to logic description 25, description 44 identical to description 32 corresponding to logic description group 27, and description 45 identical to logic description 29 as shown in FIG. 4.

When output RTL 16 generated as described above is provided for the logic synthesis tool, the generate statements of logic descriptions 23 and 27 in the input RTL has already been expanded so that unique instance names are assigned to the expanded descriptions. Therefore, the logic synthesis tool does not arbitrarily assign a hierarchical instance name to these generate statements. Accordingly, the logic synthesis tool does not arbitrarily generate a hierarchical instance name, and therefore a register under the hierarchy of a hierarchy description and the hierarchy to be verified as a black box can be easily verified.

Thus, according to the present exemplary embodiment, in the technical field of designing system such as logic synthesis, logic verification, and simulation using the Verilog language description utilizing a generate statement, an instance name is explicitly recorded when the generate statement is expanded, thereby easily analyzing a fault when it is found anywhere in the generate statement of the input Verilog description.

As described above, the logic design support system according to the present exemplary embodiment can also be realized by allowing a computer such as a personal computer or a workstation to read a computer program for realizing the system and execute the program. The program for allowing the computer to functioning as a logic design support system is read to the computer through a computer-readable recording medium such as CD-ROM or over a network. The scope of the present invention also includes a program used to direct a computer to function as the logic design support system, and a program product or computer-readable recording medium storing the program.

According to another exemplary embodiment of the present invention, it is desired that a description to specify a generation format for an instance name is included in a dedicated comment to allow a logic expansion unit to assign a unique instance name to an instance obtained by expanding a generate statement based on the generation format. With the configuration, a hierarchical instance described in a generate statement of the portion specified by the dedicated comment is uniquely expanded by the instance name in the specified format. Therefore, with the configuration, by generating an RTL of Verilog partially expanded to record an instance name by the name of the specified format, correct verification can be performed when logic synthesis and logic verification are performed on the RTL in case that a black box is included under the hierarchy in the generate statement.

While exemplary embodiments of the present invention have been described using specific terms, such description is for illustrative purposes only, and it is to be understood that changes and variations may be made without departing from the spirit or scope of the following claims.

What is claimed is:

1. A logic design support system which supports logic design using an HDL, comprising:
    RTL analysis means for receiving, as input, an input RTL including a dedicated comment as a comment statement specifying expansion of a generate statement, detecting the dedicated comment from the input RTL, and retrieving a generate statement to be expanded;
    logic expansion means for expanding the generate statement retrieved by the RTL analysis means; and
    RTL output means for merging a portion not retrieved by the RTL analysis means from the input RTL with a portion expanded by the logic expansion means, and generating and outputting output RTL.

2. The system according to claim 1, wherein the HDL is Verilog.

3. The system according to claim 1, wherein:
    the dedicated comment includes a description of specifying a generation format of an instance name; and
    the logic expansion means assigns a unique instance name to an instance obtained by expanding the generate statement based on the generation format.

4. The system according to claim 1, wherein the dedicated comment comprises a dedicated comment arranged immediately before the generate statement to be expanded for starting expansion, and a dedicated comment arranged immediately after the generate statement to be expanded for terminating the expansion.

5. The system according to claim 4, wherein the RTL analysis means retrieves as the generate statement to be expanded a portion enclosed by the dedicated comment for starting the expansion and the dedicated comment for terminating the expansion.

* * * * *